United States Patent
Liu et al.

(10) Patent No.: US 11,456,362 B2
(45) Date of Patent: Sep. 27, 2022

(54) EPITAXIAL STRUCTURE AND SEMICONDUCTOR DEVICE

(71) Applicant: GlobalWafers Co., Ltd., Hsinchu (TW)

(72) Inventors: Jia-Zhe Liu, Hsinchu (TW); Tzu-Yao Lin, Hsinchu (TW); Ying-Ru Shih, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 169 days.

(21) Appl. No.: 16/952,105

(22) Filed: Nov. 19, 2020

(65) Prior Publication Data

US 2021/0151570 A1 May 20, 2021

(30) Foreign Application Priority Data

Nov. 20, 2019 (TW) .................... 108142106

(51) Int. Cl.
*H01L 29/267* (2006.01)
*H01L 21/02* (2006.01)

(52) U.S. Cl.
CPC ........ *H01L 29/267* (2013.01); *H01L 21/0254* (2013.01); *H01L 21/02378* (2013.01); *H01L 21/02458* (2013.01); *H01L 21/02505* (2013.01)

(58) Field of Classification Search
None
See application file for complete search history.

(56) References Cited

U.S. PATENT DOCUMENTS

| | | | |
|---|---|---|---|
| 9,680,056 B1 | 6/2017 | Zhang et al. | |
| 2011/0073911 A1* | 3/2011 | Sato | H01L 29/872 257/E29.166 |
| 2015/0200257 A1* | 7/2015 | Kim | H01L 29/201 438/478 |
| 2018/0233590 A1* | 8/2018 | Inoue | H01L 29/42316 |
| 2018/0277363 A1 | 9/2018 | Narukawa et al. | |
| 2018/0323265 A1* | 11/2018 | Liu | H01L 29/207 |
| 2019/0346624 A1* | 11/2019 | Soltani | G02B 6/12 |

FOREIGN PATENT DOCUMENTS

| | | |
|---|---|---|
| JP | 2007059719 | 3/2007 |
| TW | 201135967 | 10/2011 |

\* cited by examiner

*Primary Examiner* — Khaja Ahmad
(74) *Attorney, Agent, or Firm* — JCIPRNET (57) ABSTRACT

An epitaxial structure and a semiconductor device are provided in which the epitaxial structure includes at least a SiC substrate, a nucleation layer, and a GaN layer. The nucleation layer is formed on the SiC substrate. The material of the nucleation layer is aluminum gallium nitride doped with a dopant, the Al content in the nucleation layer changes from high to low in the thickness direction, the lattice constant of the nucleation layer is between 3.08 Å and 3.21 Å, and the doping concentration of the nucleation layer changes from high to low in the thickness direction. The GaN layer is formed on the nucleation layer.

13 Claims, 5 Drawing Sheets

EPITAXIAL STRUCTURE AND SEMICONDUCTOR DEVICE

CROSS-REFERENCE TO RELATED APPLICATION

This application claims the priority benefit of Taiwan application serial no. 108142106, filed on Nov. 20, 2019. The entirety of the above-mentioned patent application is hereby incorporated by reference herein and made a part of this specification.

BACKGROUND

Technical Field

The disclosure relates to a semiconductor structure, more particularly to an epitaxial structure and a semiconductor device.

Description of Related Art

As environmental protection becomes a widely concerned issue, a strong focus has been placed on developments in car chargers. With a higher voltage withstanding capability, frequency, and output power, gallium nitride (GaN) and silicon carbide (SiC) are the two elements that are most likely to replace traditional silicon power elements.

However, a considerable difference in the energy level (an increased ΔEg) and a lattice mismatch between GaN and SiC are likely to lead to an increase in defect density and forward voltage Vf of the elements, compromising conductivity.

SUMMARY

The disclosure provides an epitaxial structure which alleviates problems of a traditional heterojunction and improves epitaxial characteristics and electrical property of an element.

The disclosure provides a semiconductor device which improves the electrical property of the element.

The epitaxial structure of the disclosure includes a SiC substrate, a nucleation layer, and a GaN layer. The nucleation layer is formed on the SiC substrate. The material of the nucleation layer is AlGaN doped with a dopant. A lattice constant of the nucleation layer is between 3.08 Å and 3.21 Å. A content of Al in the nucleation layer changes from high to low in a thickness direction, and a doping concentration of the nucleation layer changes from high to low in the thickness direction. An initial value of the doping concentration is $5E18$ $cm^{-3}$ to $1E20$ $cm^{-3}$, and an end value of the doping concentration is $1E18$ $cm^{-3}$ to $5E19$ $cm^{-3}$. A GaN layer is formed on the nucleation layer.

In an embodiment of the disclosure, the dopant in the nucleation layer includes silicon, iron, magnesium or carbon.

In an embodiment of the disclosure, the content of Al in the nucleation layer reduces gradually in the thickness direction. The doping concentration reduces gradually in the thickness direction, and the lattice constant of the nucleation layer increases gradually in the thickness direction. An initial value of the content of Al is 80% to 100%. An end value of the content of Al is 0 to 20%. A gradual slope of the content of Al is −0.1%/nm to −20%/nm. An initial value of the doping concentration is $5E18$ $cm^{-3}$ to $5E19$ $cm^{-3}$. An end value of the doping concentration is $5E18$ $cm^{-3}$ to $2E19$ $cm^{-3}$. An initial value of the lattice constant is 3.11±0.03 Å. An end value of the lattice constant is 3.18±0.03 Å. An energy gap (Eg) of the nucleation layer reduces gradually from 6.13±1 eV to 3.42±1 eV in the thickness direction.

In an embodiment of the disclosure, the content of Al in the nucleation layer reduces gradually in the thickness direction, and the doping concentration reduces gradually in the thickness direction. The lattice constant of the nucleation layer increases gradually in the thickness direction. An initial value of the content of Al is 10% to 60%. An end value of the content of Al is 0 to 20%. A gradual slope of the content of Al is −0.1%/nm to −20%/nm. An initial value of the doping concentration is $5E18$ $cm^{-3}$ to $5E19$ $cm^{-3}$, and an end value of the doping concentration is $5E18$ $cm^{-3}$ to $2E19$ $cm^{-3}$. An initial value of the lattice constant is 3.151±0.03 Å. An end value of the lattice constant is 3.18±0.03 Å. An Eg of the nucleation layer reduces gradually from 4.78±1 eV to 3.42±1 eV in the thickness direction.

In an embodiment of the disclosure, the content of Al in the nucleation layer reduces stepwise in the thickness direction, and the doping concentration reduces stepwise in the thickness direction. The lattice constant of the nucleation layer increases stepwise in the thickness direction. An initial value of the content of Al is 80% to 100%. An end value of the content of Al is 0 to 20%. A step slope of the content of Al is −0.1%/step to −50%/step. An initial value of the doping concentration is $5E18$ $cm^{-3}$ to $5E19$ $cm^{-3}$, and an end value of the doping concentration is $5E18$ $cm^{-3}$ to $2E19$ $cm^{-3}$. An initial value of the lattice constant is 3.11±0.03 Å. An end value of the lattice constant is 3.18±0.03 Å. An Eg of the nucleation layer reduces gradually from 6.13±1 eV to 3.42±1 eV in the thickness direction.

In an embodiment of the disclosure, the content of Al in the nucleation layer reduces stepwise in the thickness direction, and the doping concentration reduces stepwise in the thickness direction. The lattice constant of the nucleation layer increases stepwise in the thickness direction. An initial value of the content of Al is 10% to 60%. An end value of the content of Al is 0 to 20%. A step slope of the content of Al is −0.1%/step to −50%/step. An initial value of the doping concentration is $5E18$ $cm^{-3}$ to $5E19$ $cm^{-3}$, and an end value of the doping concentration is $5E18$ $cm^{-3}$ to $2E19$ $cm^{-3}$. An initial value of the lattice constant is 3.151±0.03 Å. An end value of the lattice constant is 3.18±0.03 Å. An Eg of the nucleation layer reduces gradually from 4.78±1 eV to 3.42±1 eV in the thickness direction.

In an embodiment of the disclosure, the content of Al in the nucleation layer reduces stepped-gradually in the thickness direction, and the doping concentration reduces stepped-gradually in the thickness direction. The lattice constant of the nucleation layer increases stepped-gradually in the thickness direction. An initial value of the content of Al is 80% to 100%. An end value of the content of Al is 0 to 20%. A gradual slope of the content of Al is −0.1%/nm to −50%/nm. A step slope of the content of Al is −0.1%/step to −50%/step. An initial value of the doping concentration is $5E18$ $cm^{-3}$ to $5E19$ $cm^{-3}$, and an end value of the doping concentration is $5E18$ $cm^{-3}$ to $2E19$ $cm^{-3}$. An initial value of the lattice constant is 3.11±0.03 Å. An end value of the lattice constant is 3.18±0.03 Å. An Eg of the nucleation layer reduces gradually from 6.13±1 eV to 3.42±1 eV in the thickness direction.

In an embodiment of the disclosure, the content of Al in the nucleation layer reduces stepped-gradually in the thickness direction, and the doping concentration reduces stepped-gradually in the thickness direction. The lattice constant of the nucleation layer increases stepped-gradually in the thickness direction. An initial value of the content of Al is 10% to 60%. An end value of the content of Al is 0 to 20%. A gradual slope of the content of Al is −0.1%/nm to −50%/nm. A step slope of the content of Al is −0.1%/step to −50%/step. An initial value of the doping concentration is 5E18 cm$^{-3}$ to 5E19 cm$^{-3}$, and an end value of the doping concentration is 5E18 cm$^{-3}$ to 2E19 cm$^{-3}$. An initial value of the lattice constant is 3.151±0.03 Å. An end value of the lattice constant is 3.18±0.03 Å. An Eg of the nucleation layer reduces gradually from 4.78±1 eV to 3.42±1 eV in the thickness direction.

In an embodiment of the disclosure, the nucleation layer is composed of 2 to 50 thin film layers.

The semiconductor device of the disclosure includes the epitaxial structure.

In summary, the disclosure uses AlGaN with specific changes in the doping concentration that is configured between the SiC substrate and the GaN layer as the nucleation layer to improve lattice matching between GaN and SiC and reduce defect density and forward voltage of the element, thereby improving the electrical property of the element.

In order to enable a clear comprehension of the aforementioned features and advantages of the disclosure, embodiments accompanied with drawings are described in detail below.

DESCRIPTION OF THE EMBODIMENTS

Hereinafter, some embodiments are listed and described in detail with accompanying drawings, but the provided embodiments are not intended to limit the scope of the disclosure. In addition, the drawings are for illustrative purposes only and are not drawn according to the original size. For a clearer explanation, the same elements in the following description will be described with the same symbols.

Figure 1:
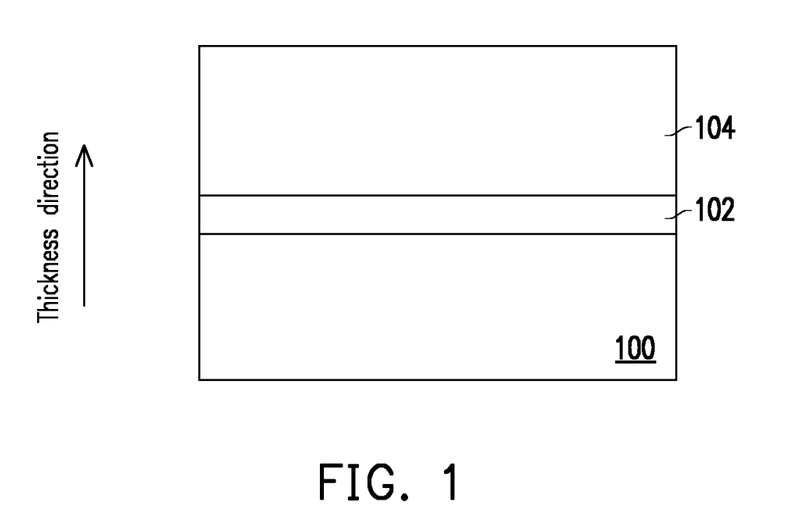
FIG. 1 is a schematic cross-sectional diagram of an epitaxial structure according to an embodiment of the disclosure.

FIG. 1 is a schematic cross-sectional diagram of an epitaxial structure according to an embodiment of the disclosure.

Referring to FIG. 1, the epitaxial structure of this embodiment includes a silicon carbide (SiC) substrate 100, a nucleation layer 102 and a gallium nitride (GaN) layer 104. The nucleation layer 102 is formed on the SiC substrate 100. The material of the nucleation layer 102 is aluminum gallium nitride (Al$_x$Ga$_{1-x}$N; x is less than 1) doped with a dopant. The lattice constant of the nucleation layer 102 is between 3.08 Å and 3.21 Å. The content of Al in the nucleation layer 102 changes from high to low in the thickness direction, and the doping concentration of the nucleation layer 102 changes from high to low in the thickness direction. In an embodiment, the initial value of the doping concentration is 5E18 cm$^{-3}$ to 1E20 cm$^{-3}$, and the end value of the doping concentration is 1E18 cm$^{-3}$ to 5E19 cm$^{-3}$. The GaN layer 104 is formed on the nucleation layer 102, and the conductivity state of the SiC substrate 100, the nucleation layer 102, and the GaN layer 104 are all n+-type, but the disclosure is not limited thereto. In this embodiment, an example of the thickness of the nucleation layer is between 1 nm and 1000 nm, or preferably between 1 nm and 200 nm. In addition, although FIG. 1 shows a whole layer of the nucleation layer 102, it should be understood that the nucleation layer 102 may be composed of multiple thin film layers in the thickness direction. Moreover, the definition of a "thin film layer" described in the disclosure is a variation in the value x in Al$_x$Ga$_{1-x}$N. For example, the nucleation layer 102 is composed of 2 to 50 thin film layers. The content of Al in the nucleation layer 102 may reduce gradually, stepwise, or stepped-gradually in the thickness direction. The above-mentioned changes in the content of Al are detailed below.

Referring to FIG. 1 again, examples of the dopant in the nucleation layer 102 are silicon, iron, magnesium or carbon; considering the lattice matching between the SiC substrate 100 and the GaN layer 104, the dopant is preferably silicon. The doping concentration of the nucleation layer 102 may reduce gradually, stepwise, or stepped-gradually in the thickness direction. The above-mentioned changes in the doping concentration are detailed below.

In this embodiment, the nucleation layer 102 is configured between the SiC substrate 100 and the GaN layer 104. Specific doping concentration changes of the nucleation layer 102 improves the lattice matching of the epitaxial structure and reduces the defect density and forward voltage of the element, thereby improving the electrical property of the element.

FIG. 2 to FIG. 7 are curve diagrams of the doping concentration, the energy level, and the lattice constant of different exemplary epitaxial structures in the thickness direction in the above embodiment.

Figure 2:
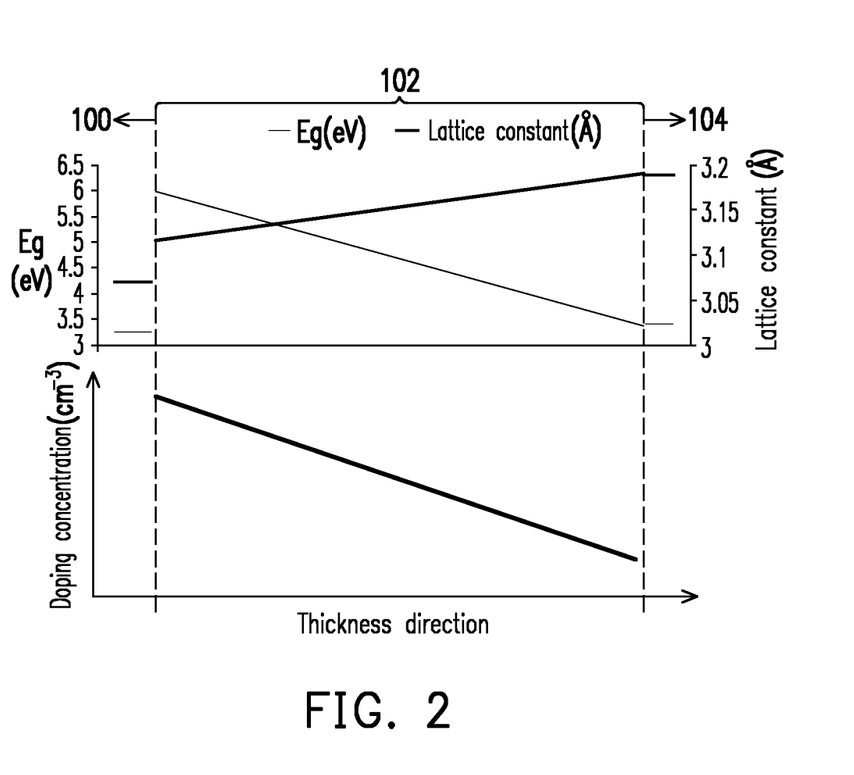
FIG. 2 is a curve diagram of a doping concentration, an energy level and a lattice constant of a part of the epitaxial structure in the thickness direction in the above embodiment.

In the nucleation layer 102 of FIG. 2, the doping concentration reduces gradually in the thickness direction, and the lattice constant increases gradually in the thickness direction. "Reducing or increasing gradually" in the disclosure refers to a continuous reduction or increase in the thickness direction. In an embodiment using silicon as the dopant, the initial value of the doping concentration is 5E18 cm$^{-3}$ to 1E20 cm$^{-3}$, or preferably 5E18 cm$^{-3}$ to 5E19 cm$^{-3}$; the end value of the doping concentration is 1E18 cm$^{-3}$ to 5E19 cm$^{-3}$, or preferably 5E18 cm$^{-3}$ to 2E19 cm$^{-3}$. An example of the initial value of the lattice constant of the nucleation layer 102 is 3.11±0.03 Å, or preferably 3.11±0.01 Å; an example of the end value of the lattice constant is 3.18±0.03 Å, or preferably 3.18±0.01 Å. An example of changes of the energy gap (Eg) of the nucleation layer 102 is that the Eg of the nucleation layer 102 reduces gradually from 6.13±1 eV to 3.42±1 eV in the thickness direction, or preferably from 6.13±0.5 eV to 3.42±0.5 eV In addition, FIG. 2 does not show the content of Al in the nucleation layer 102, but under this condition, the content of Al reduces gradually in the thickness direction. Moreover, an example of the initial value of the content of Al is 80% to 100%, or preferably 90% to 100%; an example of the end value of the content of Al is 0 to 20%, or preferably 0 to 10%; and an example of the gradual slope of the content of Al is −0.1%/nm to −20%/nm, or preferably −0.1%/nm to −10%/nm.

Figure 3:
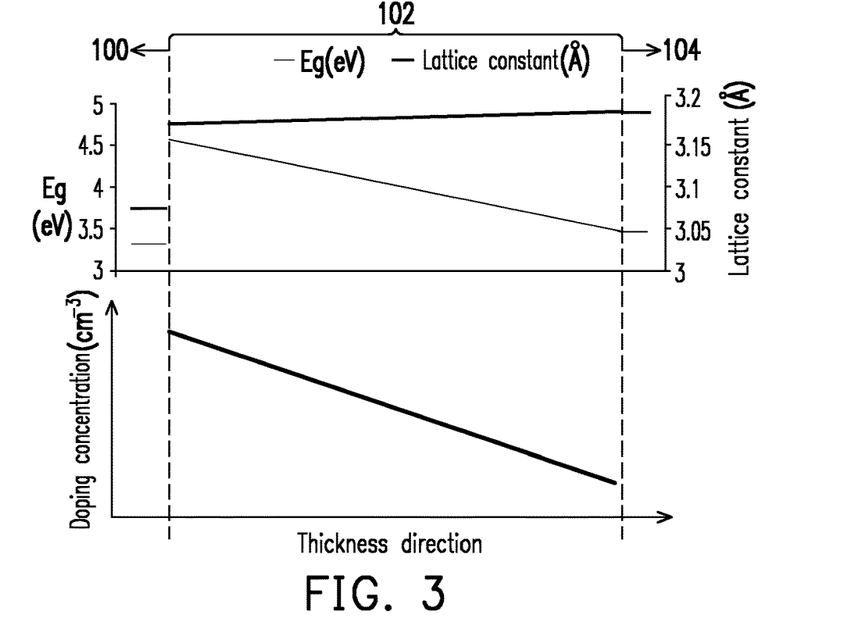
FIG. 3 is a curve diagram of a doping concentration, an energy level and a lattice constant of a part of the epitaxial structure in the thickness direction in the above embodiment.

In the nucleation layer 102 of FIG. 3, the doping concentration reduces gradually in the thickness direction, and the lattice constant increases gradually in the thickness direction. In an embodiment using silicon as the dopant, the initial value of the doping concentration is 5E18 $cm^{-3}$ to 1E20 $cm^{-3}$, or preferably 5E18 $cm^{-3}$ to 5E19 $cm^{-3}$; the end value of the doping concentration is 1E18 $cm^{-3}$ to 5E19 $cm^{-3}$, or preferably 5E18 $cm^{-3}$ to 2E19 $cm^{-3}$. An example of the initial value of the lattice constant of the nucleation layer 102 is 3.151±0.03 Å, or preferably 3.151±0.01 Å; an example of the end value of the lattice constant is 3.18±0.03 Å, or preferably 3.18±0.01 Å. The Eg of the nucleation layer 102 reduces gradually from 4.78±1 eV to 3.42±1 eV in the thickness direction, or preferably from 4.78±0.5 eV to 3.42±0.5 eV. In addition, FIG. 3 does not show the content of Al in the nucleation layer 102, but under this condition, the content of Al reduces gradually in the thickness direction. Moreover, an example of the initial value of the content of Al is 10% to 60%, or preferably 40% to 60%; an example of the end value of the content of Al is 0 to 20%, or preferably 0 to 10%; and an example of the gradual slope of the content of Al is −0.1%/nm to −20%/nm, or preferably −0.1%/nm to −10%/nm.

Figure 4:
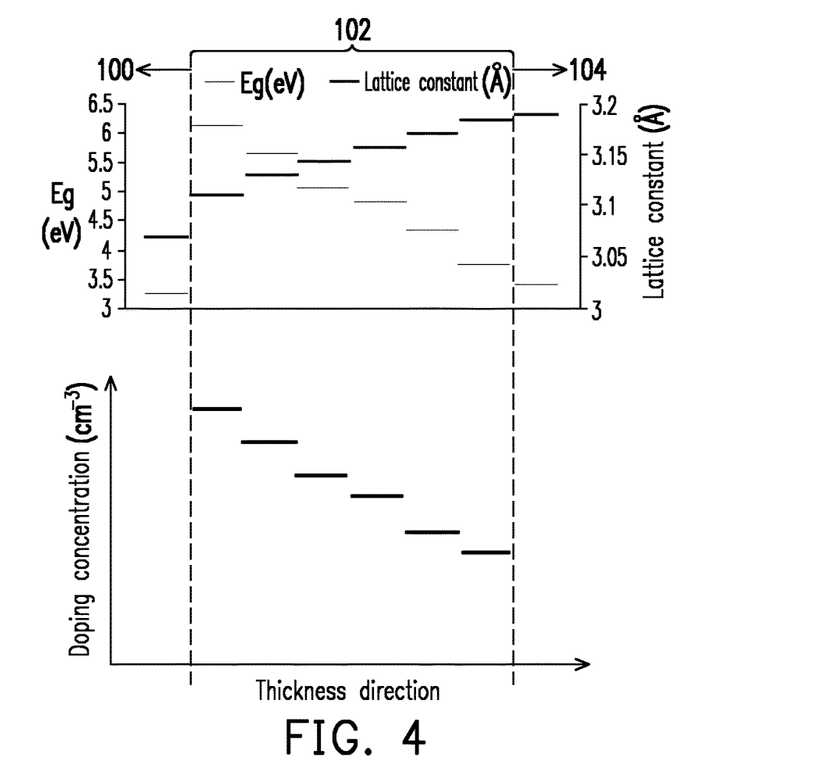
FIG. 4 is a curve diagram of a doping concentration, an energy level and a lattice constant of a part of the epitaxial structure in the thickness direction in the above embodiment.

In the nucleation layer 102 in FIG. 4, the doping concentration reduces stepwise in the thickness direction, and the lattice constant increases stepwise in the thickness direction. "Reducing or increasing stepwise" in the disclosure refers to a gradual reduction or increase in the thickness direction. For example, there are multiple stepped sections in FIG. 4, and the value in each of the stepped sections does not change. In an embodiment using silicon as the dopant, the initial value of the doping concentration is 5E18 $cm^{-3}$ to 1E20 $cm^{-3}$, or preferably 5E18 $cm^{-3}$ to 5E19 $cm^{-3}$; the end value of the doping concentration is 1E18 $cm^{-3}$ to 5E19 $cm^{-3}$, or preferably 5E18 $cm^{-3}$ to 2E19 $cm^{-3}$. An example of the initial value of the lattice constant of the nucleation layer 102 is 3.11±0.03 Å, or preferably 3.11±0.01 Å; an example of the end value of the lattice constant is 3.18±0.03 Å, or preferably 3.18±0.01 Å. An example of changes of the Eg of the nucleation layer 102 is that the Eg of the nucleation layer 102 reduces stepwise from 6.13±1 eV to 3.42±1 eV in the thickness direction, or preferably from 6.13±0.5 eV to 3.42±0.5 eV. In addition, FIG. 4 does not show the content of Al in the nucleation layer 102, but under this condition, the content of Al reduces stepwise in the thickness direction. Moreover, an example of the initial value of the content of Al is 80% to 100%, or preferably 90% to 100%; an example of the end value of the content of Al is 0 to 20%, or preferably 0 to 10%; and an example of the step slope of the content of Al is −0.1%/step to −50%/step, or preferably −0.1%/step to −10%/step.

Figure 5:
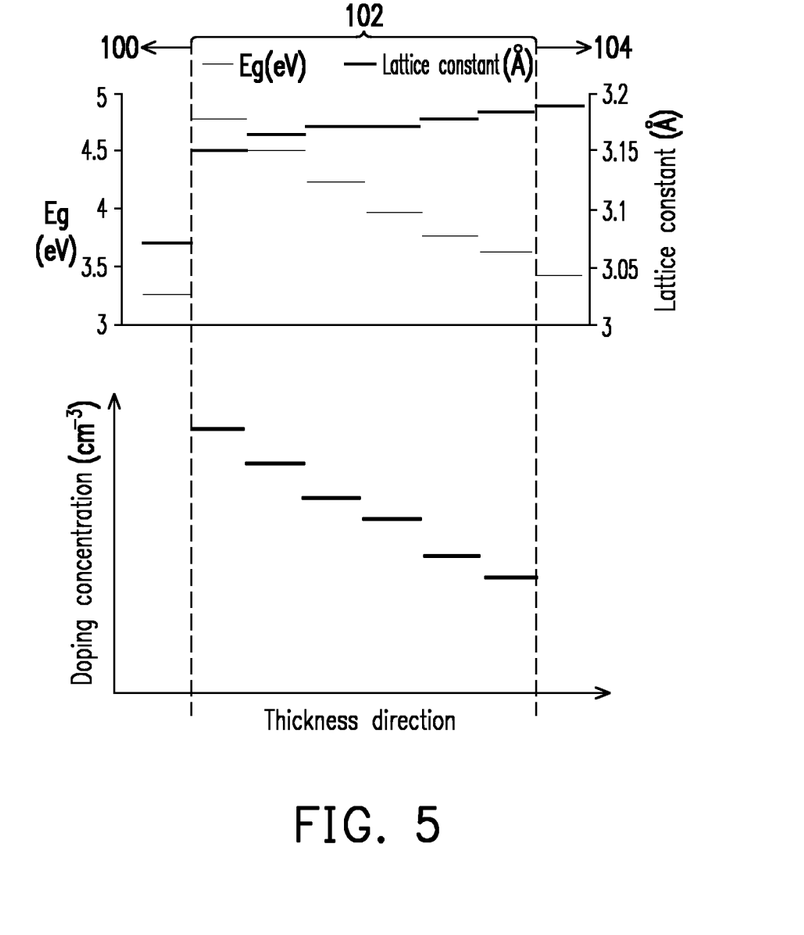
FIG. 5 is a curve diagram of a doping concentration, an energy level and a lattice constant of a part of the epitaxial structure in the thickness direction in the above embodiment.

In the nucleation layer 102 in FIG. 5, the doping concentration reduces stepwise in the thickness direction, and the lattice constant increases stepwise in the thickness direction. In an embodiment using silicon as the dopant, the initial value of the doping concentration is 5E18 $cm^{-3}$ to 1E20 $cm^{-3}$, or preferably 5E18 $cm^{-3}$ to 5E19 $cm^{-3}$; the end value of the doping concentration is 1E18 $cm^{-3}$ to 5E19 $cm^{-3}$, or preferably 5E18 $cm^{-3}$ to 2E19 $cm^{-3}$. An example of the initial value of the lattice constant of the nucleation layer 102 is 3.151±0.03 Å, or preferably 3.151±0.01 Å; an example of the end value of the lattice constant is 3.18±0.03 Å, or preferably 3.18±0.01 Å. The Eg of the nucleation layer 102 reduces stepwise from 4.78±1 eV to 3.42±1 eV in the thickness direction, or preferably from 4.78±0.5 eV to 3.42±0.5 eV. In addition, FIG. 5 does not show the content of Al in the nucleation layer 102, but under this condition, the content of Al reduces stepwise in the thickness direction. Moreover, an example of the initial value of the content of Al is 10% to 60%, or preferably 40% to 60%; an example of the end value of the content of Al is 0 to 20%, or preferably 0 to 10%; and an example of the step slope of the content of Al is −0.1%/step to −50%/step, or preferably −0.1%/step to −10%/step.

Figure 6:
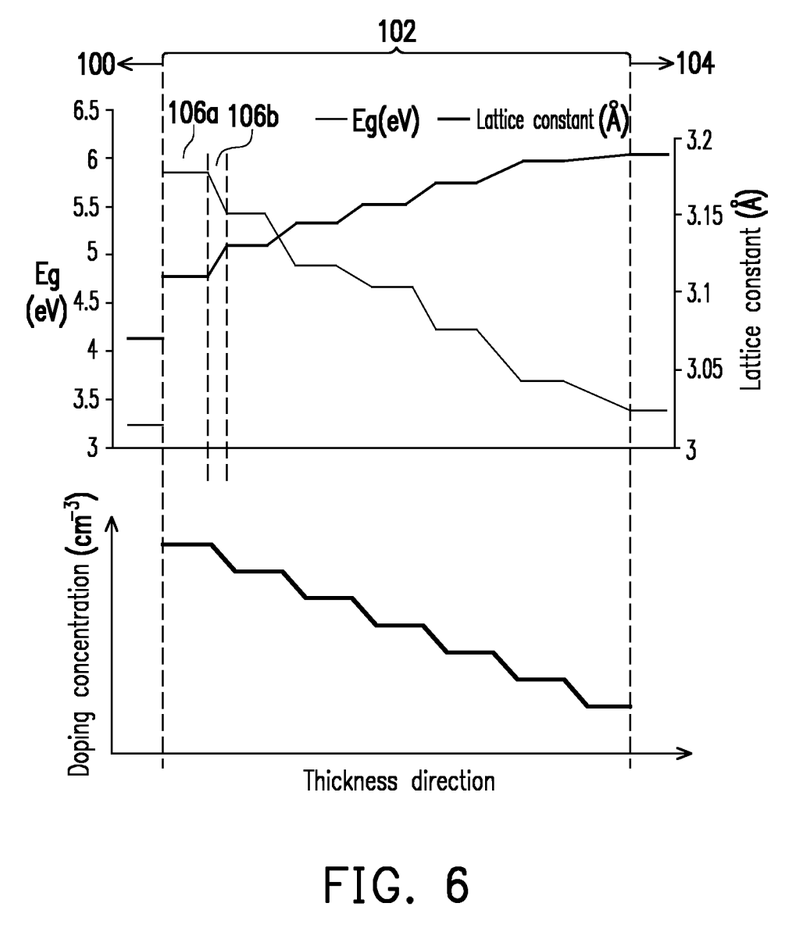
FIG. 6 is a curve diagram of a doping concentration, an energy level and a lattice constant of a part of the epitaxial structure in the thickness direction in the above embodiment.

In the nucleation layer 102 in FIG. 6, the doping concentration reduces stepped-gradually in the thickness direction, and the lattice constant increases stepped-gradually in the thickness direction. "Reducing or increasing stepped-gradually" in the disclosure refers to changes of reduction or increase in a step region 106a and a gradual change region 106b in the thickness direction. In an embodiment using silicon as the dopant, the initial value of the doping concentration is 5E18 $cm^{-3}$ to 1E20 $cm^{-3}$, or preferably 5E18 $cm^{-3}$ to 5E19 $cm^{-3}$; the end value of the doping concentration is 1E18 $cm^{-3}$ to 5E19 $cm^{-3}$, or preferably 5E18 $cm^{-3}$ to 2E19 $cm^{-3}$. An example of the initial value of the lattice constant of the nucleation layer 102 is 3.11±0.03 Å, or preferably 3.11±0.01 Å; an example of the end value of the lattice constant is 3.18±0.03 Å, or preferably 3.18±0.01 Å. An example of changes of the Eg of the nucleation layer 102 is that the Eg of the nucleation layer 102 reduces stepped-gradually from 6.13±1 eV to 3.42±1 eV in the thickness direction, or preferably from 6.13±0.5 eV to 3.42±0.5 eV In addition, FIG. 6 does not show the content of Al in the nucleation layer 102, but under this condition, the content of Al reduces stepped-gradually in the thickness direction. Moreover, an example of the initial value of the content of Al is 80% to 100%, or preferably 90% to 100%; an example of the end value of the content of Al is 0 to 20%, or preferably 0 to 10%; an example of the gradual slope of content of Al is −0.1%/nm to −50%/nm, or preferably −0.1%/nm to −20%/nm; and an example of the step slope of the content of Al is −0.1%/step to −50%/step, or preferably −0.1%/step to −10%/step.

Figure 7:
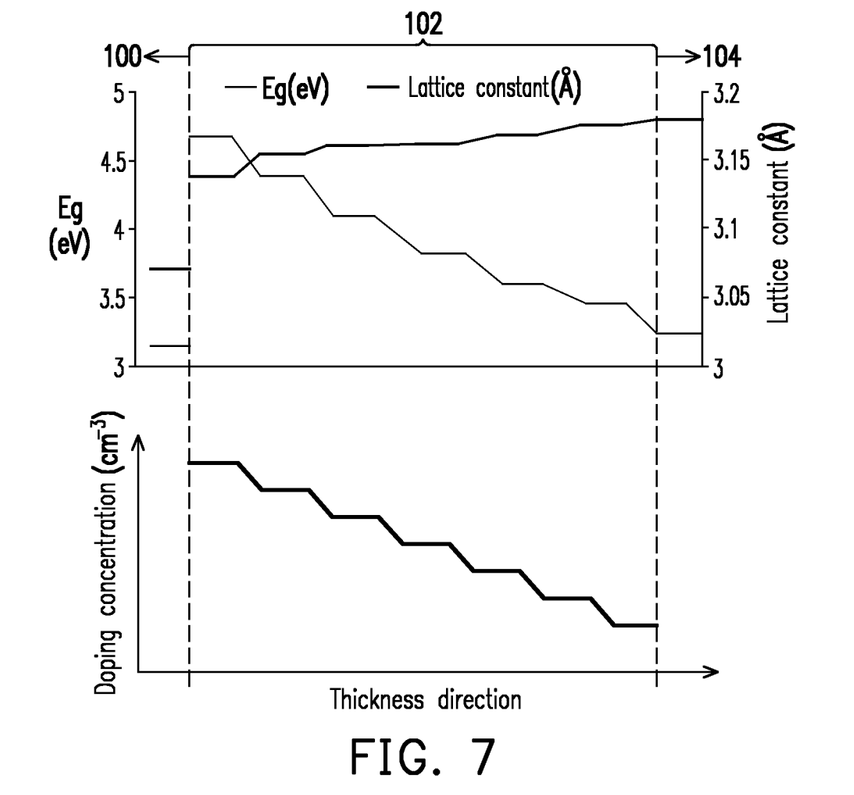
FIG. 7 is a curve diagram of a doping concentration, an energy level and a lattice constant of a part of the epitaxial structure in the thickness direction in the above embodiment.

In the nucleation layer 102 in FIG. 7, the doping concentration reduces stepped-gradually in the thickness direction, and the lattice constant increases stepped-gradually in the thickness direction. In an embodiment using silicon as the dopant, the initial value of the doping concentration is 5E18 $cm^{-3}$ to 1E20 $cm^{-3}$, or preferably 5E18 $cm^{-3}$ to 5E19 $cm^{-3}$; the end value of the doping concentration is 1E18 $cm^{-3}$ to 5E19 $cm^{-3}$, or preferably 5E18 $cm^{-3}$ to 2E19 $cm^{-3}$. The initial value of the lattice constant of the nucleation layer 102 is 3.151±0.03 Å, or preferably 3.151±0.01 Å; the end value of the lattice constant is 3.18±0.03 Å, or preferably 3.18±0.01 Å. The Eg of the nucleation layer 102 reduces stepped-gradually from 4.78±1 eV to 3.42±1 eV in the thickness direction, or preferably from 4.78±0.5 eV to 3.42±0.5 eV In addition, FIG. 7 does not show the content of Al in the nucleation layer 102, but under this condition, the content of Al reduces stepped-gradually in the thickness direction. Moreover, an example of the initial value of the content of Al is 10% to 60%, or preferably 40% to 60%; an example of the end value of the content of Al is 0 to 20%, or preferably 0 to 10%; an example of the gradual slope of the content of Al is −0.1%/nm to −50%/nm, or preferably −0.1%/nm to −20%/nm; and an example of the step slope of the content of Al is −0.1%/step to −50%/step, or preferably −0.1%/step to −10%/step.

Figure 8:
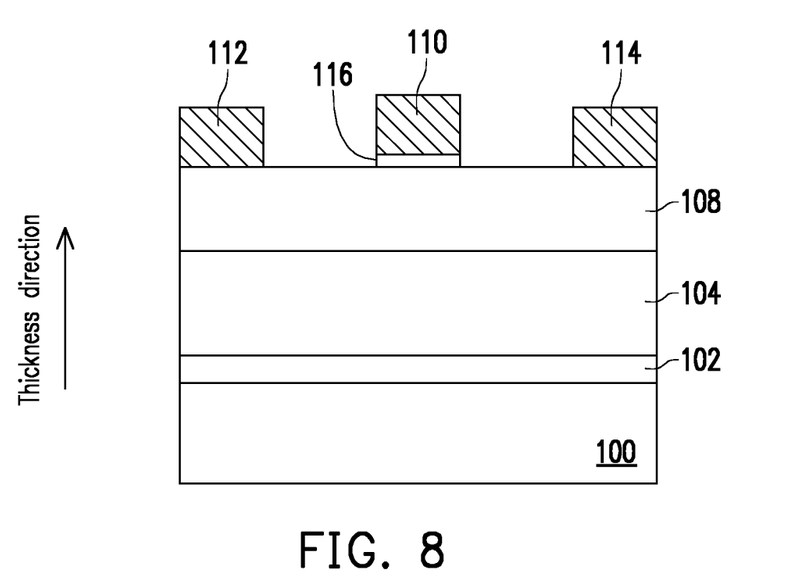
FIG. 8 is a schematic cross-sectional diagram of a semiconductor device according to another embodiment of the disclosure.

FIG. 8 is a schematic cross-sectional diagram of a semiconductor device according to another embodiment of the disclosure. In the schematic cross-sectional diagram, the same or similar members are represented by the same or similar element symbols adopted in the previous embodiment, and the descriptions of the same members may be found in the previous embodiment, which is not explained hereinafter.

Referring to FIG. 8, a semiconductor device of a second embodiment is exemplified by a semiconductor power element which may include the epitaxial structure of FIG. 1 (the SiC substrate 100, the nucleation layer 102, and the GaN layer 104), a barrier layer 108, a gate 110, a source 112, a drain 114, and a gate insulating layer 116. The GaN layer 104 may serve as a channel layer, and a two-dimensional electron gas (2DEG) is generated close to the interface between the GaN layer 104 and the barrier layer 108 due to a polarization effect. In addition, other functional film layers may be added to the device of FIG. 8 based on other requirements. However, the disclosure is not limited hereto. Any semiconductor devices including the epitaxial structure of the previous embodiment fall within the scope of the disclosure.

In summary, the disclosure uses AlGaN with specific changes in the doping concentration as the nucleation layer that is configured between the SiC substrate and the GaN layer, so as to reduce the lattice mismatch between GaN and SiC, the defect density, and the forward voltage of the element, thereby improving the electrical property of the semiconductor element.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. An epitaxial structure, including:
a silicon carbide (SiC) substrate;
a nucleation layer formed on the substrate, wherein a material of the nucleation layer is aluminum gallium nitride (AlGaN) doped with a dopant, a lattice constant of the nucleation layer is between 3.08 Å and 3.21 Å, a content of Al in the nucleation layer changes from high to low in a thickness direction, and a doping concentration of the nucleation layer changes from high to low in the thickness direction, an initial value of the doping concentration is $5E18\ cm^{-3}$ to $1E20\ cm^{-3}$, and an end value of the doping concentration is $1E18\ cm^{-3}$ to $5E19\ cm^{-3}$; and
a gallium nitride (GaN) layer formed on the nucleation layer.

2. The epitaxial structure according to claim 1, wherein the dopant in the nucleation layer comprises silicon, iron, magnesium or carbon.

3. The epitaxial structure according to claim 1, wherein the content of Al in the nucleation layer reduces gradually in the thickness direction, the doping concentration reduces gradually in the thickness direction, and the lattice constant of the nucleation layer increases gradually in the thickness direction, and
an initial value of the content of Al is 80% to 100%, an end value of the content of Al is 0 to 20%, and a gradual slope of the content of Al is −0.1%/nm to −20%/nm,
an initial value of the doping concentration is $5E18\ cm^{-3}$ to $5E19\ cm^{-3}$, and an end value of the doping concentration is $5E18\ cm^{-3}$ to $2E19\ cm^{-3}$,
an initial value of the lattice constant is 3.11±0.03 Å, and an end value of the lattice constant is 3.18±0.03 Å, and
an energy gap (Eg) of the nucleation layer reduces gradually from 6.13±1 eV to 3.42±1 eV in the thickness direction.

4. The epitaxial structure according to claim 1, wherein the content of Al in the nucleation layer reduces gradually in the thickness direction, the doping concentration reduces gradually in the thickness direction, and the lattice constant of the nucleation layer increases gradually in the thickness direction, and
an initial value of the content of Al is 10% to 60%, an end value of the content of Al is 0 to 20%, and a gradual slope of the content of Al is −0.1%/nm to −20%/nm,
an initial value of the doping concentration is $5E18\ cm^{-3}$ to $5E19\ cm^{-3}$, and an end value of the doping concentration is $5E18\ cm^{-3}$ to $2E19\ cm^{-3}$,
an initial value of the lattice constant is 3.151±0.03 Å, and an end value of the lattice constant is 3.18±0.03 Å, and
an Eg of the nucleation layer reduces gradually from 4.78±1 eV to 3.42±1 eV in the thickness direction.

5. The epitaxial structure according to claim 1, wherein the content of Al in the nucleation layer reduces stepwise in the thickness direction, the doping concentration reduces stepwise in the thickness direction, and the lattice constant of the nucleation layer increases stepwise in the thickness direction, and
an initial value of the content of Al is 80% to 100%, an end value of the content of Al is 0 to 20%, and a step slope of the content of Al is −0.1%/step to −50%/step,
an initial value of the doping concentration is $5E18\ cm^{-3}$ to $5E19\ cm^{-3}$, and an end value of the doping concentration is $5E18\ cm^{-3}$ to $2E19\ cm^{-3}$,
an initial value of the lattice constant is 3.11±0.03 Å, and an end value of the lattice constant is 3.18±0.03 Å, and
an Eg of the nucleation layer reduces stepwise from 6.13±1 eV to 3.42±1 eV in the thickness direction.

6. The epitaxial structure according to claim 5, wherein the nucleation layer is composed of 2 to 50 thin film layers.

7. The epitaxial structure according to claim 1, wherein the content of Al in the nucleation layer reduces stepwise in the thickness direction, the doping concentration reduces stepwise in the thickness direction, and the lattice constant of the nucleation layer increases stepwise in the thickness direction, and
an initial value of the content of Al is 10% to 60%, an end value of the content of Al is 0 to 20%, and a step slope of the content of Al is −0.1%/step to −50%/step,
an initial value of the doping concentration is $5E18\ cm^{-3}$ to $5E19\ cm^{-3}$, and an end value of the doping concentration is $5E18\ cm^{-3}$ to $2E19\ cm^{-3}$, an initial value of the lattice constant is 3.151±0.03 Å, and an end value of the lattice constant is 3.18±0.03 Å, and an Eg of the nucleation layer reduces stepwise from 4.78±1 eV to 3.42±1 eV in the thickness direction.

8. The epitaxial structure according to claim 7, wherein the nucleation layer is composed of 2 to 50 thin film layers.

9. The epitaxial structure according to claim 1, wherein the content of Al in the nucleation layer reduces stepped-gradually in the thickness direction, the doping concentration reduces stepped-gradually in the thickness direction, and the lattice constant of the nucleation layer increases stepped-gradually in the thickness direction, and an initial value of the content of Al is 80% to 100%, an end value of the content of Al is 0 to 20%, a gradual slope of the content of Al is −0.1%/nm to −50%/nm, and a step slope of the content of Al is −0.1%/step to −50%/step, an initial value of the doping concentration is 5E18 cm$^{-3}$ to 5E19 cm$^{-3}$, and an end value of the doping concentration is 5E18 cm$^{-3}$ to 2E19 cm$^{-3}$, an initial value of the lattice constant is 3.11±0.03 Å, and an end value of the lattice constant is 3.18±0.03 Å, and an Eg of the nucleation layer reduces stepped-gradually from 6.13±1 eV to 3.42±1 eV in the thickness direction.

10. The epitaxial structure according to claim 9, wherein the nucleation layer is composed of 2 to 50 thin film layers.

11. The epitaxial structure according to claim 1, wherein the content of Al in the nucleation layer reduces stepped-gradually in the thickness direction, the doping concentration reduces stepped-gradually in the thickness direction, and the lattice constant of the nucleation layer increases stepped-gradually in the thickness direction, and an initial value of the content of Al is 10% to 60%, an end value of the content of Al is 0 to 20%, a gradual slope of the content of Al is −0.1%/nm to −50%/nm, and a step slope of the content of Al is −0.1%/step to −50%/step, an initial value of the doping concentration is 5E18 cm$^{-3}$ to 5E19 cm$^{-3}$, and an end value of the doping concentration is 5E18 cm$^{-3}$ to 2E19 cm$^{-3}$, an initial value of the lattice constant is 3.151±0.03 Å, and an end value of the lattice constant is 3.18±0.03 Å, and an Eg of the nucleation layer reduces stepped-gradually from 4.78±1 eV to 3.42±1 eV in the thickness direction.

12. The epitaxial structure according to claim 11, wherein the nucleation layer is composed of 2 to 50 thin film layers.

13. A semiconductor device comprising the epitaxial structure according to claim 1.

* * * * *